United States Patent
Lee et al.

(10) Patent No.: US 7,405,119 B2
(45) Date of Patent: Jul. 29, 2008

(54) STRUCTURE AND METHOD FOR A SIDEWALL SONOS MEMORY DEVICE

(75) Inventors: Tzyh-Cheang Lee, Hsinchu (TW);
Fu-Liang Yang, Hsin-Chu (TW);
Jiunn-Ren Hwang, Hsin-Chu (TW);
Tsung-Lin Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 349 days.

(21) Appl. No.: 11/327,185

(22) Filed: Jan. 6, 2006

(65) Prior Publication Data

US 2007/0161195 A1    Jul. 12, 2007

(51) Int. Cl.
*H01L 21/8239* (2006.01)

(52) U.S. Cl. .......... 438/216; 438/287; 438/303; 438/954; 257/E21.626

(58) Field of Classification Search .......... 438/954
See application file for complete search history.

(56) References Cited

U.S. PATENT DOCUMENTS

| | | | |
|---|---|---|---|
| 6,756,271 B1 * | 6/2004 | Satoh et al. ............. | 438/258 |
| 6,858,497 B2 * | 2/2005 | Moriya et al. .......... | 438/262 |
| 7,102,192 B2 * | 9/2006 | Ono ........................ | 257/316 |
| 7,154,142 B2 * | 12/2006 | Wong et al. ............ | 257/316 |
| 2004/0005761 A1 * | 1/2004 | Shibata ................... | 438/261 |
| 2007/0063267 A1 * | 3/2007 | Jeon et al. .............. | 257/324 |

* cited by examiner

*Primary Examiner*—Stephen W Smoot
(74) *Attorney, Agent, or Firm*—Slater & Matsil, L.L.P.

(57) ABSTRACT

A system and method for a sidewall SONOS memory device is provided. An electronic device includes a non-volatile memory. A substrate includes source/drain regions. A gate stack is directly over the substrate and between the source/drain regions. The gate stack has a sidewall. A nitride spacer is formed adjacent to the gate stack. A first oxide material is formed directly adjacent the spacer. An oxide-nitride-oxide structure is formed between the spacer and the gate stack. The oxide-nitride-oxide structure has a generally L-shaped cross-section on at least one side of the gate stack. The oxide-nitride-oxide structure includes a vertical portion and a horizontal portion. The vertical portion is substantially aligned with the sidewall and located between the first oxide material and the gate sidewall. The horizontal portion is substantially aligned with the substrate and located between the first oxide and the substrate.

20 Claims, 5 Drawing Sheets

STRUCTURE AND METHOD FOR A SIDEWALL SONOS MEMORY DEVICE

TECHNICAL FIELD

The present invention generally relates to memory devices. In one aspect it relates more particularly to a system and method for a sidewall SONOS memory device.

BACKGROUND

Non-volatile memory has been integrated into a wide range of electronic technologies, including cellular communication, digital video, digital audio, and compact data storage (i.e., flash memory cards, flash memory sticks, and USB flash drives). Silicon-oxide-nitride-oxide-silicon (SONOS) memory is a non-volatile semiconductor memory, at the heart of which is a transistor that can retain a value without a constant power supply. During operation, a conventional SONOS memory transistor stores a single charge in a nitride layer sandwiched between two thin oxide layers. The oxide layers are in turn sandwiched between two silicon layers. These two silicon layers are typically a polysilicon gate electrode (i.e., the controlling gate) and the silicon substrate.

Sidewall SONOS technology improves upon SONOS technology by storing two bits per transistor. A sidewall SONOS transistor stores two discrete bits, in contrast with the one bit stored by a conventional SONOS transistor. FIG. 1 shows the cross-section of a known sidewall SONOS transistor 10. The transistor 10 includes an oxide 16 formed around a gate electrode 12 and a gate dielectric 14. The gate dielectric 14 is directly over a silicon substrate 17. A material 18 with charge trapping properties overlies the substrate 17, and includes portions 22 that are directly adjacent the oxide 16. A silicon dioxide spacer 20 is adjacent the gate electrode 12.

The sidewall SONOS transistor 10 is repeated thousands, millions, and billions of times in a memory array (not shown). Because the sidewall SONOS transistor 10 is repeated numerous times, the design of the sidewall SONOS transistor 10 is critical to the reliability and compactness of the SONOS memory as a whole.

The sidewall SONOS transistor 10 in FIG. 1 has several disadvantages. First, the sidewall SONOS transistor 10 may suffer from electron drift. During operation, an electric charge is stored in the region 22. However, the region 22 is electrically connected to larger adjacent regions of the charge storing material 18, and electrons (not shown) in the region 22 may drift, thus degrading the charge density in the region 22. Charge density in the region 22 is critical to the performance of the sidewall SONOS transistor 10. The degradation of electric charge density in the region 22 may erroneously alter the value read from the transistor 10. The flaw is compounded by the number of times the sidewall SONOS transistor 10 is repeated in the SONOS memory.

In addition to suffering from electron drift, the sidewall SONOS transistor 10 shown in FIG. 1 is poorly suited for downward scalability. For example, the transistor 10 may not be scalable to a semiconductor process technology generation below 0.130 microns (μm). The transistor 10 has a silicon dioxide ($SiO_2$) spacer 20, but technological barriers exist, which prevent the manufacturing of $SiO_2$ gate spacers in sub-0.130 μm semiconductor manufacturing technologies. In addition, the substantially L-shaped formation of the region 22 of the charge trapping material 18 is not reproducible in a sub-0.130 μm manufacturing technology.

FIG. 2 shows a cross-section of a conventional sidewall SONOS transistor 30 manufactured in a sub-0.130 μm technology generation. The transistor 30 includes a gate spacer 32, separated from the gate electrode 12 and gate dielectric 14, by an oxide 16. The spacer 32 has charge storing properties, and during operation an electric charge may be formed in the spacer 32. However, the spacer 32 is sufficiently voluminous to suffer from electron drift. The dissipation of electrons in the spacer 32 reduces the charge density in the spacer 32, resulting in possible data retention and reliability issues.

Hence, there is a need for a reliable SONOS transistor that is scalable to sub-0.130 μm semiconductor manufacturing technology generations.

SUMMARY OF THE INVENTION

The problems and needs outlined above may be addressed by embodiments of the present invention. In accordance with one aspect of the present invention, a method for manufacturing a semiconductor device is described. This method includes the following steps described in this paragraph, and the order of steps may vary, if not otherwise stated. A gate stack is formed on a substrate. The gate stack has a sidewall. An oxide-nitride-oxide stack is formed over the gate stack and along the sidewall. The oxide-nitride-oxide stack is etched to form an oxide-nitride-oxide storage film structure, which has a generally L-shaped cross-section with a vertical portion and a horizontal portion. The vertical portion is along at least part of the gate stack sidewall and a horizontal portion is along the substrate. A logic oxide spacer is formed over the gate stack and the oxide-nitride-oxide storage film structure, such that a nitride portion of the oxide-nitride-oxide storage film structure is enclosed in oxide material of the oxide-nitride-oxide storage film structure and of the logic oxide spacer layer. A nitride spacer material is formed over the gate stack, over the oxide-nitride-oxide storage film structure, and over the logic oxide spacer layer. The nitride spacer material is etched to form a nitride spacer adjacent to the gate stack and at least partially over the oxide-nitride-oxide storage film structure and the logic oxide spacer layer. A source/drain region is formed in the substrate. The source/drain region is directly adjacent the nitride spacer.

In accordance with another illustrative embodiment of the present invention, a method of manufacturing a semiconductor memory device using a sub-0.130 micron manufacturing process is described. This method includes the following steps described in this paragraph. The order of the steps may vary, may be sequential, may overlap, may be in parallel, and combinations thereof, if not otherwise stated. A gate stack is formed on a substrate. The gate stack has a sidewall and the gate stack has a gate width of about 130 nanometers or less. An oxide-nitride-oxide stack is formed over the gate stack and along the sidewall. The oxide-nitride-oxide stack is etched to form an oxide-nitride-oxide storage film structure. The oxide-nitride-oxide storage film structure has a generally L-shaped cross-section with a vertical portion and a horizontal portion. The vertical portion is along at least part of the gate stack sidewall and a horizontal portion along the substrate. A logic oxide spacer layer is formed over the gate stack and the oxide-nitride-oxide storage film structure, such that a nitride portion of the oxide-nitride-oxide storage film structure is enclosed in oxide material of the oxide-nitride-oxide storage film structure and of the logic oxide spacer layer. A nitride spacer material is formed over the gate stack, the oxide-nitride-oxide storage film structure, and the logic oxide spacer layer. The nitride spacer material is etched to form a nitride spacer adjacent to the gate stack and at least partially over the oxide-nitride-oxide storage film structure and the logic oxide spacer layer. A source/drain region is formed in the substrate. The source/drain region is directly adjacent the nitride spacer.

In accordance with another illustrative embodiment of the present invention, a method of manufacturing a non-volatile memory includes the formation of a gate stack directly over a substrate. This method includes the following steps described in this paragraph, and the order of steps may vary, if not otherwise stated. The gate stack includes a sidewall. A tunneling oxide layer is formed over the substrate. A silicon nitride layer is formed directly over the tunneling oxide material. A sacrificial oxide layer is formed directly over the silicon nitride storage film material. Portions of the tunneling oxide layer are removed. Portions of the silicon nitride layer are removed. Portions of the sacrificial oxide layer are removed. The removal of the tunneling oxide layer, the removal of the silicon nitride layer, and the removal of the sacrificial oxide layer form an oxide-nitride-oxide structure. A remaining portion of the silicon nitride layer in the oxide-nitride-oxide structure is a storage film. The method of manufacturing a non-volatile memory further includes the formation of a logic oxide spacer material over the substrate. A silicon nitride spacer material is formed directly over the logic oxide spacer material. Portions of the logic oxide spacer material and portions of the silicon nitride spacer material are removed to form a silicon nitride spacer adjacent to the sidewall. A first portion of the oxide-nitride-oxide structure is directly adjacent and substantially aligned with the sidewall of the gate stack and a second portion of the oxide-nitride-oxide structure is directly adjacent and substantially aligned with a channel region in the substrate. The channel region in the substrate is adjacent the gate stack. The storage film is encapsulated by oxide materials of the oxide-nitride-oxide structure, and by the logic oxide spacer material. A source/drain region is formed in the substrate. The deep/source drain region is directly adjacent the nitride spacer.

In accordance with another illustrative embodiment of the present invention, an electronic device is described. The electronic device includes a non-volatile memory. The non-volatile memory includes a substrate with source/drain regions. A gate stack is directly over the substrate and between the source/drain regions. The gate stack has a sidewall. A nitride spacer is formed adjacent to the gate stack. A first oxide material is formed directly adjacent the spacer. An oxide-nitride-oxide structure is formed between the spacer and the gate stack. The oxide-nitride-oxide structure has a generally L-shaped cross-section on at least one side of the gate stack. The oxide-nitride-oxide structure includes a vertical portion and a horizontal portion. The vertical portion is substantially aligned with the sidewall and located between the first oxide material and the gate sidewall. The horizontal portion is substantially aligned with the substrate and located between the first oxide and the substrate.

In accordance with another illustrative embodiment of the present invention, a non-volatile sub-0.130 micron semiconductor memory device is described. The non-volatile sub-0.130 micron semiconductor memory device includes a substrate with source/drain regions. A gate stack is directly over the substrate and between the source/drain regions. The semiconductor memory device further includes a sidewall, a nitride spacer, a first oxide material, an oxide-nitride-oxide structure, a vertical portion, and a horizontal portion. The nitride spacer is formed adjacent to the gate stack. The first oxide material is formed directly adjacent to the spacer. The oxide-nitride-oxide structure located between the spacer and the gate stack, the oxide-nitride-oxide structure comprising. The vertical portion is substantially aligned with the sidewall and disposed directly between the first oxide material and the gate sidewall. The vertical portion includes a top surface. The top surface is substantially perpendicular to the sidewall and directly under the first oxide. The horizontal portion is substantially aligned with the substrate and is directly between the first oxide and the substrate. The horizontal portion includes a side surface. The side surface of the horizontal portion is substantially perpendicular to the substrate and is directly adjacent the first oxide material. The first side surface of the vertical portion of the oxide-nitride-oxide structure and the bottom surface of the horizontal portion of the oxide-nitride-oxide structure include an oxide characterized as a tunneling oxide. The second side surface of the vertical portion of the oxide-nitride-oxide structure and the top surface of the horizontal portion of the oxide-nitride-oxide structure include an oxide characterized as a sacrificial oxide. The oxide-nitride-oxide structure includes silicon nitride.

In accordance with another illustrative embodiment of the present invention, a semiconductor memory device includes a substrate with source/drain regions. A gate stack is directly over the substrate and between the source/drain regions. The gate stack includes a gate electrode formed over a gate dielectric. The gate stack also includes a sidewall. The sidewall includes substantially coplanar surfaces of the gate electrode and the gate dielectric. The gate stack has a width of about 130 nanometers or less. The semiconductor memory device further includes a spacer. The spacer includes a silicon nitride logic spacer material, and is adjacent the gate stack. The semiconductor memory device further includes a first oxide material. The first oxide material is a logic spacer oxide material. The first oxide material is directly adjacent the spacer. The semiconductor memory device further includes an oxide-nitride-oxide structure between the spacer and the gate stack. The oxide-nitride-oxide structure includes a vertical portion and a horizontal portion. The vertical portion is substantially aligned with the sidewall and is disposed directly between the first oxide material and the gate sidewall. The vertical portion includes a top surface, a first side surface, and a second side surface. The top surface of the vertical portion is substantially perpendicular to the sidewall and directly under the first oxide. The first side surface of the vertical portion is directly adjacent the sidewall. The second side surface of the vertical portion is directly adjacent the first oxide material. The horizontal portion is substantially aligned with the substrate and is directly between the first oxide and the substrate. The horizontal portion includes a side surface, a top surface, and a bottom surface. The side surface of the horizontal portion is substantially perpendicular to the substrate and is directly adjacent the first oxide material. The top surface of the horizontal portion is directly under the first oxide material and is substantially aligned with the substrate. The bottom surface of the horizontal portion is directly over the surface of the substrate. The first side surface of the vertical portion of the oxide-nitride-oxide structure and the bottom surface of the horizontal portion of the oxide-nitride-oxide structure include an oxide characterized as a tunneling oxide. The second side surface of the vertical portion of the oxide-nitride-oxide structure and the top surface of the horizontal portion of the oxide-nitride-oxide structure include an oxide characterized as a sacrificial oxide. The oxide-nitride-oxide structure includes silicon nitride.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
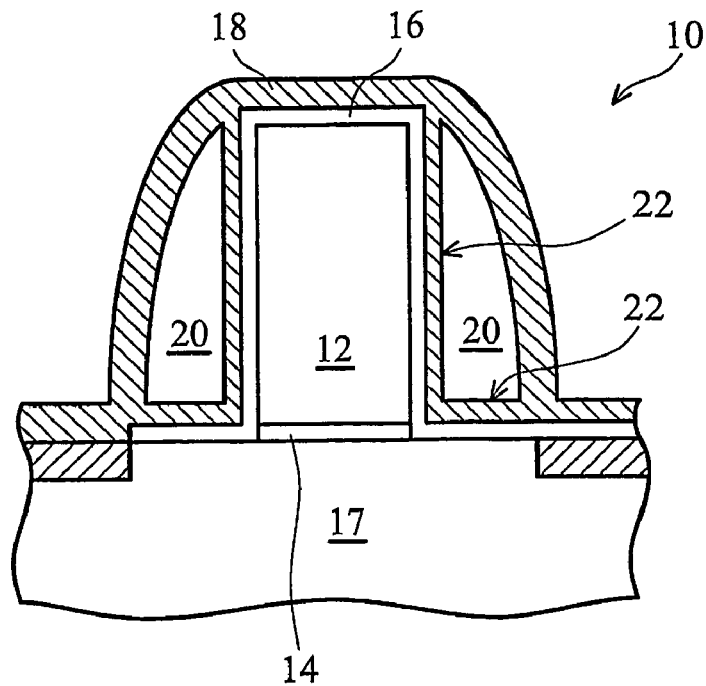
FIGS. 1 and 2 show cross-sectional views of sidewall SONOS transistors known in the art.
Figure 2:
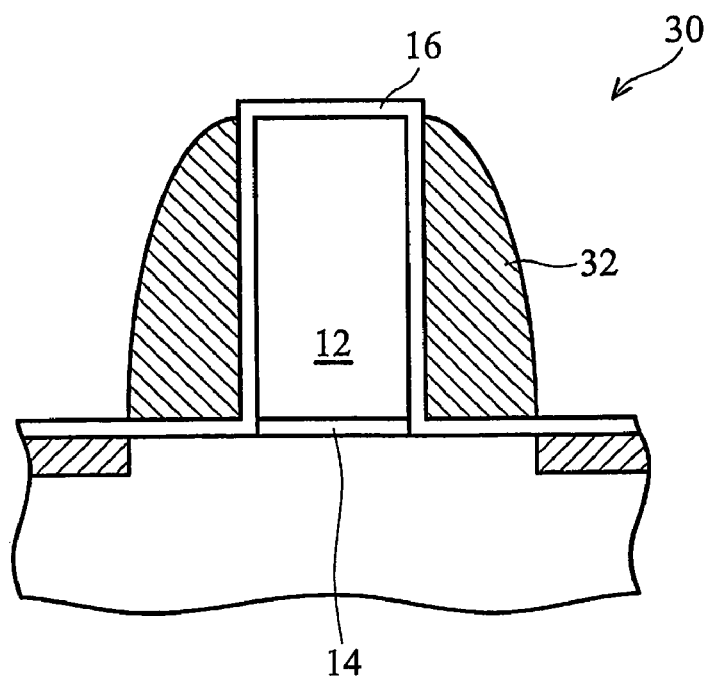

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention provides a method of manufacturing a sidewall SONOS memory device. FIGS. 3A-3F illustrate a method of manufacturing a sidewall SONOS memory device in accordance with a first illustrative embodiment of the present invention. The cross-sectional views in FIGS. 3*a*-3*f* show the sidewall SONOS transistor 100 at various stages of a 60 nanometer (nm) semiconductor manufacturing process. Although the sidewall SONOS transistor 100 of this preferred illustrative embodiment is formed in a 60 nm technology generation, other embodiments of the present invention may be formed using semiconductor manufacturing processes at any technology generation, including 0.180 μm, 0.150 μm, 0.130 μm, and 0.90 μm (a.k.a. 90 nm), for example.

Figure 3A:
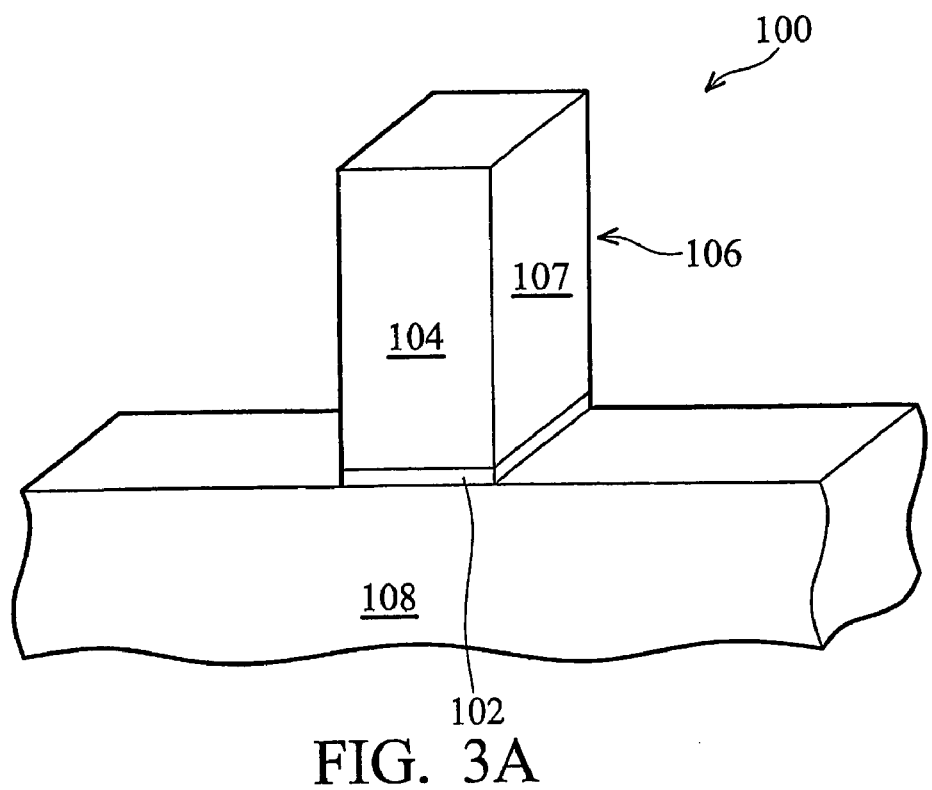
FIGS. 3A-3H show cross-sectional views of the non-volatile semiconductor memory device at various stages of a 60 nm semiconductor manufacturing process, in accordance with a preferred illustrative embodiment.

FIG. 3A shows a cross-sectional view in three dimensions of the sidewall SONOS transistor 100 at an intermediate stage of production, in accordance with a preferred illustrative embodiment. The sidewall SONOS transistor 100 includes a gate oxide 102 and a gate electrode 104. The gate oxide 102 and the gate electrode 104 are referred to collectively as a gate stack 106 herein. The gate stack 106 is directly over a p-type silicon substrate 108. A side 107 of the gate stack 106 is referred to as a sidewall 107.

Figure 3B:
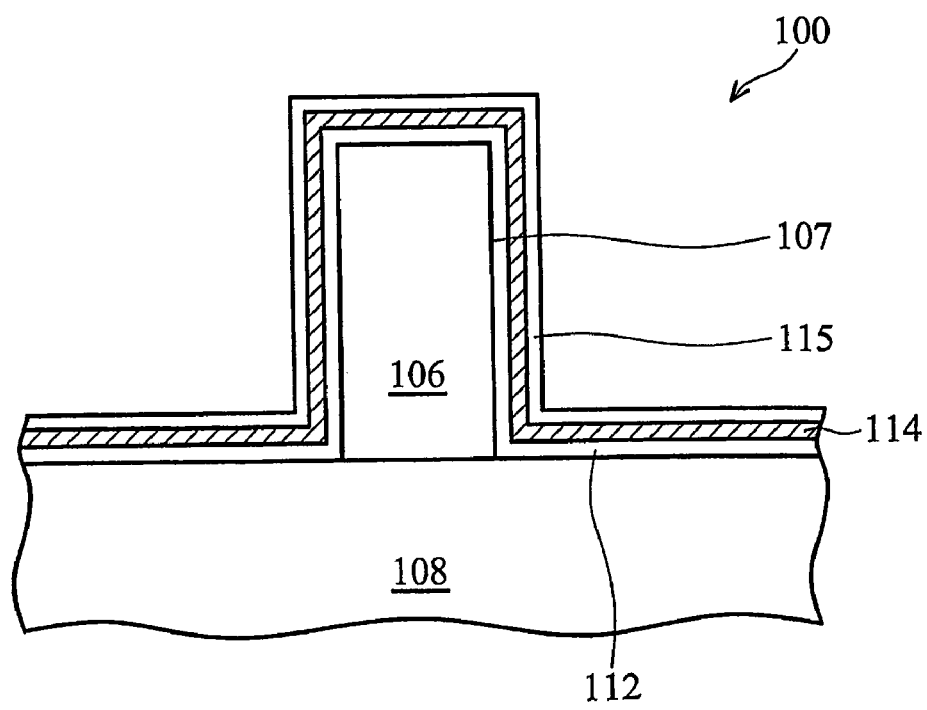

With reference to FIG. 3B, an oxide-nitride-oxide (ONO) layer 110 has been formed over the silicon substrate 108. The ONO layer 110 may also be referred to as an ONO stack 110. To form the ONO stack 110, a bottom oxide material is grown over the silicon substrate 108. The growth of the bottom oxide material 112 is followed by a SiN material 114 deposition. The deposition of the SiN material 114 is followed by the growth of a top oxide material 115. Other illustrative embodiments of the present invention include a plurality of methods and materials (not shown) to form the ONO layer 110.

Preferably, the ONO layer 110 shown in FIG. 3B is substantially conformal and immediately adjacent to underlying features 106 and 108. The bottom oxide material 112 is preferably a tunneling oxide 112, the charge storing material 114 is preferably a silicon nitride (SiN) material 114, and the top oxide 115 is preferably a sacrificial oxide material 115. The charge storing material 114 may also be referred to as a charge trapping material 114.

Figure 3C:
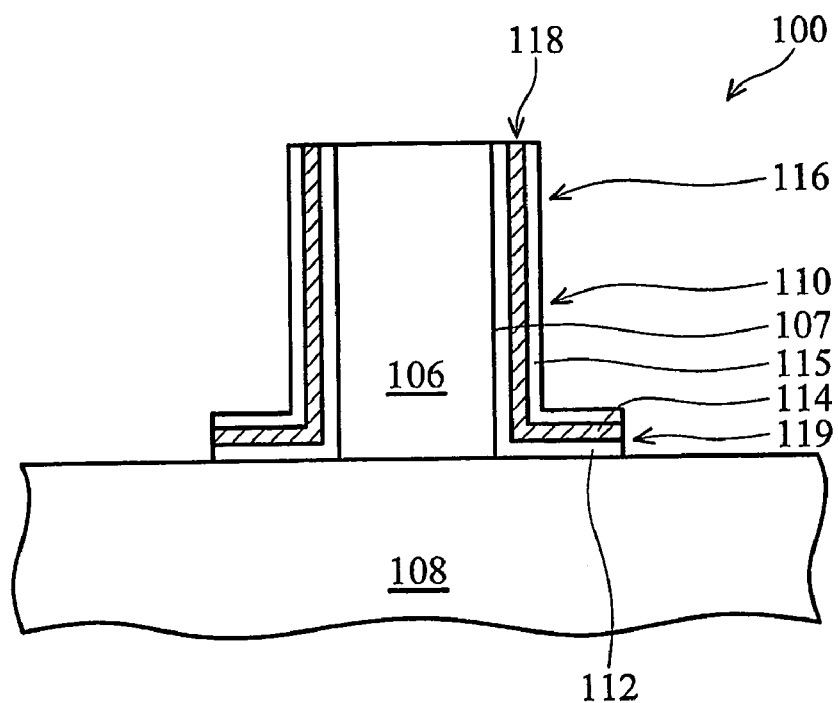

With reference to FIG. 3C, the cross-sectional view of the transistor 100 of the first embodiment is shown after a pattern and etch step has removed portions of the ONO layer 110. In the first embodiment, portions of the tunneling oxide 112, the SiN 114, and the sacrificial oxide 115 are all removed in the same etch step. However, portions of the ONO layer 110 may be removed in any suitable manner for other embodiments.

FIG. 3C illustrates that a remaining portion 116 of the ONO layer 110 is an oxide-nitride-oxide (ONO) structure 116. The ONO structure 116 has a generally L-shaped cross-section. The nitride material 114 in the L-shaped ONO structure 116 is a storage film 114 capable of storing and trapping an electric charge. The ONO structure 116 has a vertical portion 118 substantially aligned with and immediately adjacent to the gate stack sidewall 107. The ONO structure 116 also has a horizontal portion 119 substantially aligned with and immediately adjacent the silicon substrate 108.

Figure 3D:
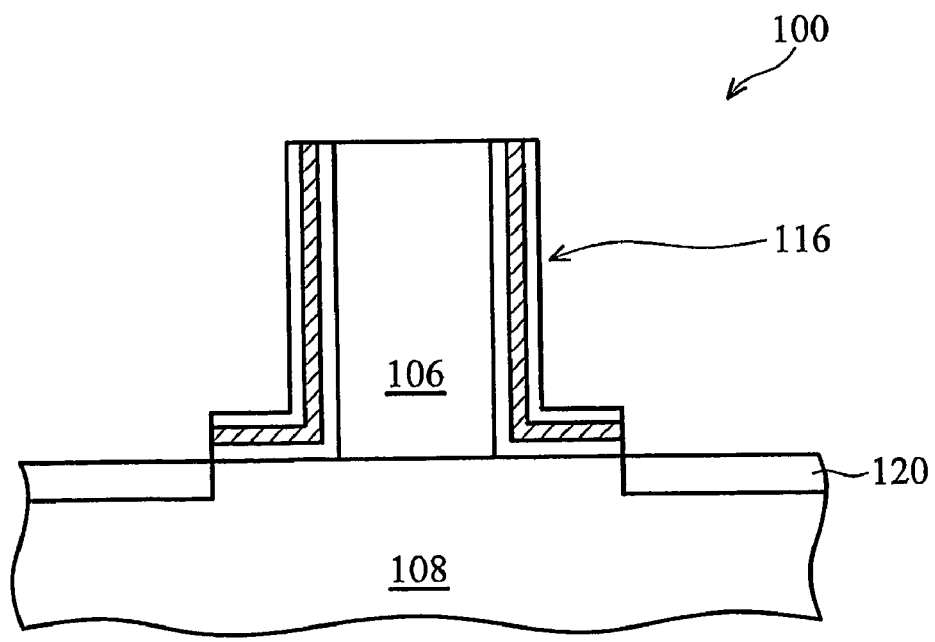

FIG. 3D shows the cross-sectional view of the SONOS transistor 100 following the formation of a lightly doped drain (LDD) region 120, in accordance with the preferred illustrative embodiment. The LDD region 120 may be formed by implantation of a dopant material (not shown), for example. The LDD region 120 may also be referred to as a source/drain extension (SDE) region 120, and may be an n-type material, for example. Preferably, the LDD region is directly adjacent the oxide-nitride-oxide structure 116.

Figure 3E:
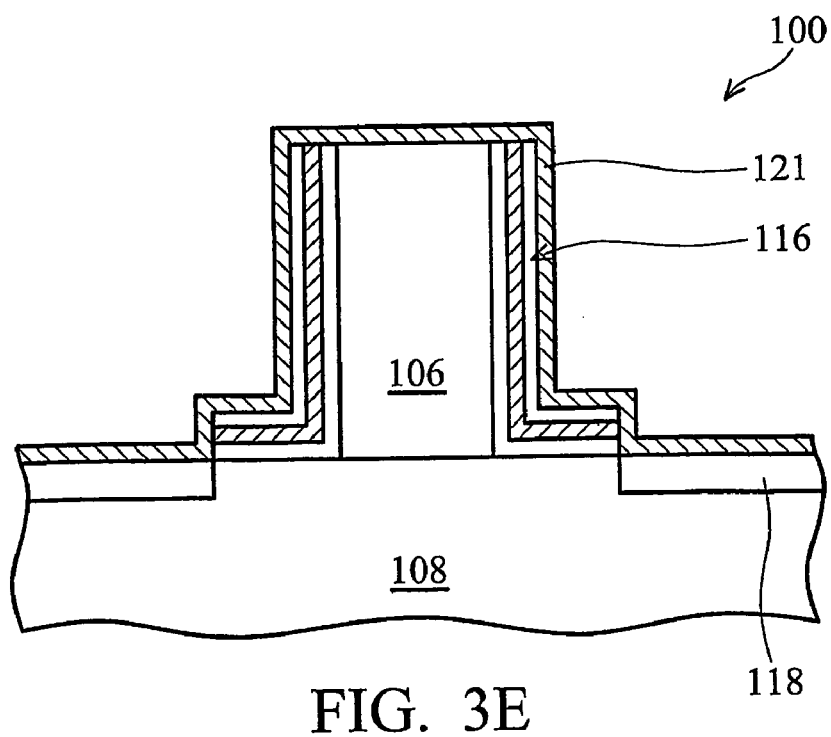

FIG. 3E shows the SONOS sidewall transistor 100 of the present invention following the growth of a dielectric material 121 over the silicon substrate 108. The dielectric material 121 is preferably a logic oxide 121. However, the dielectric material 121 may be any type of dielectric material in other embodiments. Preferably, the logic oxide material 121 is substantially conformal to features 106 and 116, and on the silicon substrate 108. The logic oxide 121 may also be referred to as a logic spacer oxide, or a spacer oxide, for example.

Figure 3F:
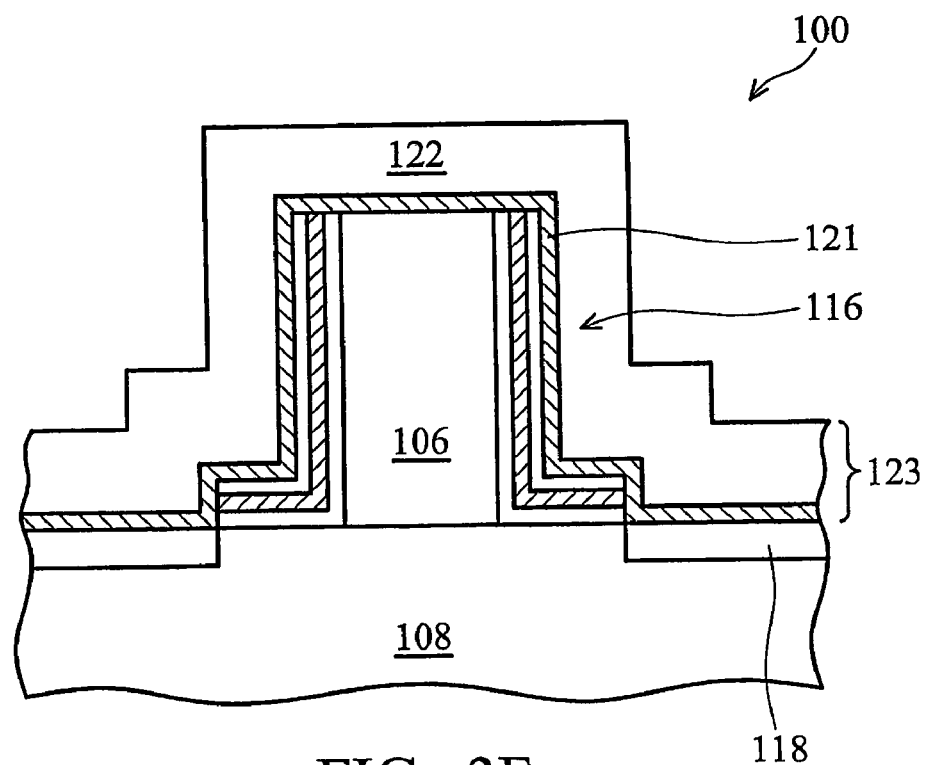

FIG. 3F shows a cross-sectional view of the SONOS transistor 100, following the deposition of a spacer material 122 directly over the logic oxide material 121, in accordance with the first embodiment. Preferably, the spacer material 122 is a silicon nitride (SiN) spacer material 122, however the spacer material 122 may be any material suitable for the formation of a gate spacer. The SiN spacer material 122 is substantially conformal to the features 106 and 116 in and on the silicon substrate 108. The logic oxide material 121 and the SiN spacer material 122 may be referred to collectively as logic materials 123.

Figure 3G:
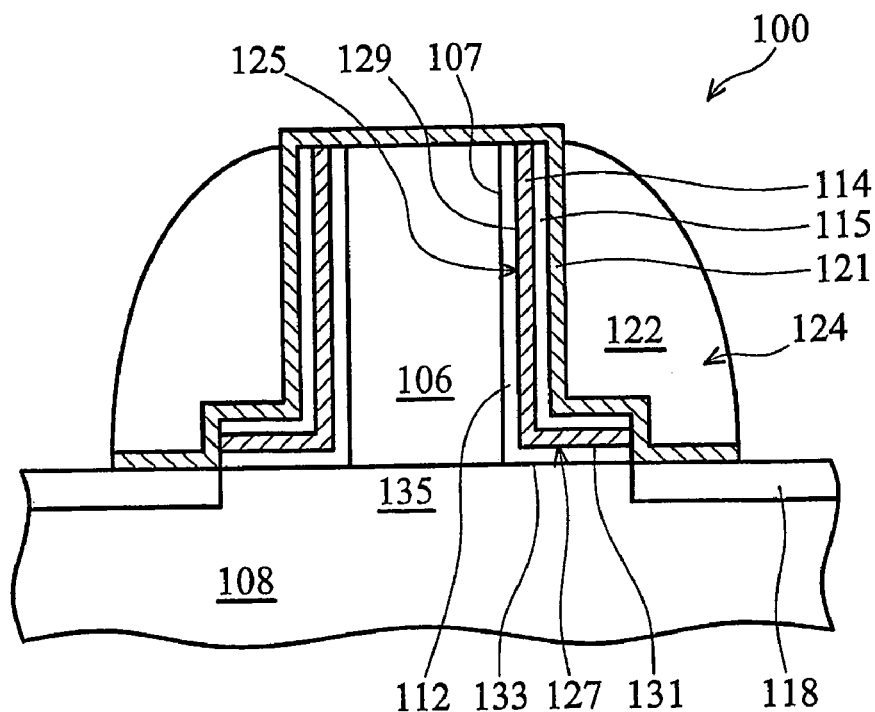

With reference to FIG. 3G, a cross-sectional view of the SONOS transistor 100 following an etch step is illustrated. The etch step is preferably a logic spacer etch step. The logic spacer etch step has removed portions of the logic oxide material 121 and the SiN spacer material 122, to form a SiN spacer 124 adjacent to and separated from the storage film 114 by the spacer oxide 121 and the sacrificial oxide 115.

As shown in FIG. 3G, the storage film 114 of the preferred illustrative embodiment is formed in a manner that promotes reliable functionality of the transistor 100 during operation. The storage film 114 is suitably sized to significantly reduce and substantially eliminate electron drift in the storage film 114 during operation. The mitigated electron drift in the storage film 114 results in enhanced charge density retention for the sub-0.130 μm transistor 100, thus enhancing the reliability of the device in which it is used (e.g., a flash card).

With continuing reference to the first embodiment shown in FIG. 3G, the L-shaped storage film 114 has two portions 125 and 127. The portion 125 has a substantially planar surface 129 that is substantially parallel to the sidewall 107 of the gate stack 106. The planar surface 129 of the storage film portion 125 is separated from the gate stack sidewall 107 by the tunneling oxide material 112. The storage film portion 127 has a planar surface 131 substantially parallel to a planar surface 133 of the channel region 135 in the silicon substrate 108. The planar surface of the storage film portion 127 is separated from the surface of the channel region 135 by the tunneling oxide 112.

The storage film 114 of the first embodiment in FIG. 3G is encapsulated in oxide materials 112, 115, and 121, which is preferred. The storage film 114 is electrically isolated from the SiN spacer 124 by the sacrificial oxide 115 and by the logic oxide material 121. Electric isolation of the storage film 114 from the SiN spacer 124 prevents unwanted electromagnetic effects that may otherwise be imposed on the storage film 114 by the SiN spacer 124 during operation. The SiN logic spacer 124 physically protects the storage film 114 and the gate stack 106 from subsequent potentially harmful and stressful manufacturing steps (i.e., contact formation).

Figure 3H:
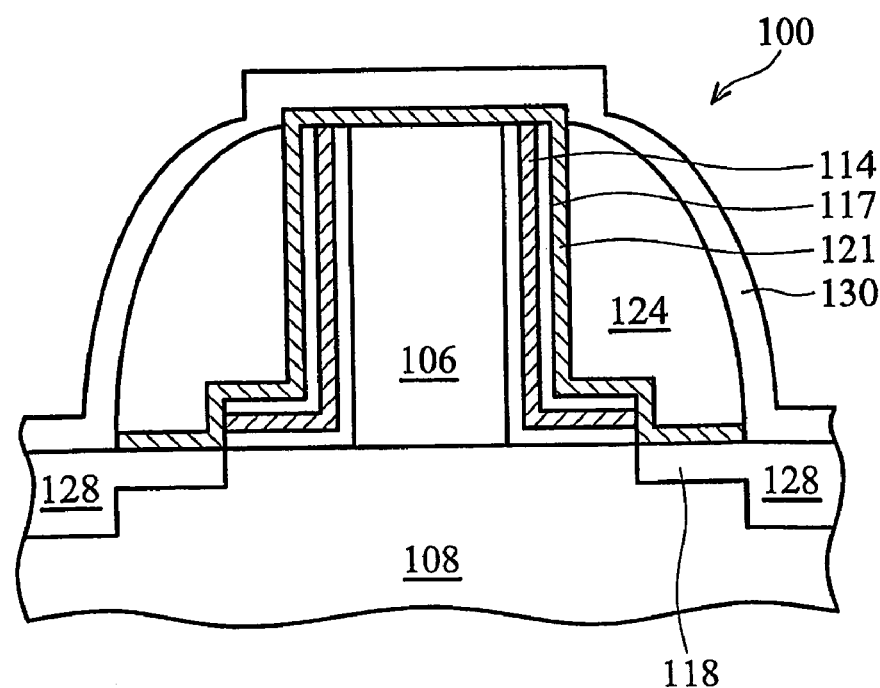

FIG. 3H shows a cross-sectional view of the transistor 100 of the first embodiment after further manufacturing steps, including the step of forming a deep source/drain region 128 and depositing a sacrificial layer 130. The source/drain region 128 is formed by implanting a dopant material (not shown) into the substrate 108. The dopant material in the source/drain region 128 is an n-type material, in this example. Following source/drain region 128 formation, a substantially conformal SiN contact etch sacrificial layer (CESL) 130 is formed over the silicon substrate 108. FIG. 3H illustrates that the logic oxide material 121 separates the storage film 114 from the overlying CESL layer 130, thus providing substantial electrical isolation to the storage film from the CESL layer 130.

Illustrative embodiments of the present invention include non-volatile memory systems (i.e., a flash memory stick, and a flash memory card) comprising the sidewall SONOS memory transistor 100. The transistor 100 may also be referred to as a sub-0.130 μm semiconductor memory device 100. Still other illustrative embodiments include electronic devices comprising non-volatile random access memory (NVRAM), in which the sub-0.130 μm semiconductor memory device 100 resides. Other illustrative embodiments include the transistor 100 in other electronic devices, such as digital video recorder (DVR) systems, digital cameras, digital audio recorders and players, laptops, desktops, navigation systems, military defense systems, communications systems such as cellular technology, and computer networks, for example.

Although embodiments of the present invention and at least some of its advantages have been described in detail, it should be understood that various changes, substitutions, and alternations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, comprising:
    forming a gate stack on a substrate, the gate stack having a sidewall;
    forming an oxide-nitride-oxide stack over the gate stack and along the sidewall;
    etching the oxide-nitride-oxide stack to form an oxide-nitride-oxide storage film structure having a generally L-shaped cross-section with a vertical portion along at least part of the gate stack sidewall and a horizontal portion along the substrate;
    forming a logic oxide spacer layer over the gate stack and the oxide-nitride-oxide storage film structure, such that a nitride portion of the oxide-nitride-oxide storage film structure is enclosed in oxide material of the oxide-nitride-oxide storage film structure and of the logic oxide spacer layer;
    forming a nitride spacer material over the gate stack, the oxide-nitride-oxide storage film structure, and the logic oxide spacer layer;
    etching the nitride spacer material to form a nitride spacer adjacent to the gate stack and at least partially over the oxide-nitride-oxide storage film structure and the logic oxide spacer layer; and
    forming a source/drain region in the substrate and directly adjacent the nitride spacer.

2. The method of claim 1, wherein the forming the oxide-nitride-oxide stack comprises:
    forming a tunneling oxide material;
    forming a silicon nitride storage film material directly over the tunneling oxide material; and
    depositing a sacrificial oxide material directly over the silicon nitride storage film material.

3. The method of claim 1, further comprising forming a lightly doped drain region in the substrate after forming the oxide-nitride-oxide storage film structure and prior to forming the logic oxide spacer layer.

4. The method of claim 1, further comprising forming a doped region in the substrate in alignment with the nitride spacer.

5. The method of claim 1, wherein the forming of the gate stack comprises:
    forming a gate oxide layer on the substrate;
    forming a gate electrode layer over the gate oxide; and
    patterning and etching the gate electrode layer, such that the gate stack has a gate width of about 130 nanometers or less.

6. The method of claim 5, wherein the gate width is about 90 nanometers or less.

7. The method of claim 5, wherein the gate electrode layer comprises polysilicon material.

8. The method of claim 1, wherein after the etching of the oxide-nitride-oxide stack to form the oxide-nitride-oxide storage film structure and before the forming of the logic oxide spacer layer, part of a nitride portion of the oxide-nitride-oxide stack is exposed.

9. The method of claim 1, wherein the method is performed using a sub-0.130 micron manufacturing process to form a memory device.

10. A method of manufacturing a semiconductor memory device using a sub-0.130 micron manufacturing process, comprising:
- forming a gate stack on a substrate, the gate stack having a sidewall and the gate stack having a gate width of about 130 nanometers or less;
- forming an oxide-nitride-oxide stack over the gate stack and along the sidewall;
- etching the oxide-nitride-oxide stack to form an oxide-nitride-oxide storage film structure having a generally L-shaped cross-section with a vertical portion along at least part of the gate stack sidewall and a horizontal portion along the substrate;
- forming a logic oxide spacer layer over the gate stack and the oxide-nitride-oxide storage film structure, such that a nitride portion of the oxide-nitride-oxide storage film structure is enclosed in oxide material of the oxide-nitride-oxide storage film structure and of the logic oxide spacer layer;
- forming a nitride spacer material over the gate stack, the oxide-nitride-oxide storage film structure, and the logic oxide spacer layer;
- etching the nitride spacer material to form a nitride spacer adjacent to the gate stack and at least partially over the oxide-nitride-oxide storage film structure and the logic oxide spacer layer; and
- forming a source/drain region in the substrate and directly adjacent the nitride spacer.

11. The method of claim 10, wherein the forming the oxide-nitride-oxide stack comprises:
- forming a tunneling oxide material;
- forming a silicon nitride storage film material directly over the tunneling oxide material; and
- depositing a sacrificial oxide material directly over the silicon nitride storage film material.

12. The method of claim 10, further comprising forming a lightly doped drain region in the substrate after forming the oxide-nitride-oxide storage film structure and prior to forming the logic oxide spacer layer.

13. The method of claim 10, further comprising forming a doped region in the substrate in alignment with the nitride spacer.

14. The method of claim 10, wherein the forming of the gate stack comprises:
- forming a gate oxide layer on the substrate;
- forming a gate electrode layer over the gate oxide; and
- patterning and etching the gate electrode layer.

15. The method of claim 10, wherein after the etching of the oxide-nitride-oxide stack to form the oxide-nitride-oxide storage film structure and before the forming of the logic oxide spacer layer, part of a nitride portion of the oxide-nitride-oxide stack is exposed.

16. A method of manufacturing a non-volatile memory, comprising:
- forming a gate stack directly over a substrate, the gate stack comprising a sidewall;
- forming a tunneling oxide layer over the substrate;
- forming a silicon nitride layer directly over the tunneling oxide layer;
- forming a sacrificial oxide layer directly over the silicon nitride layer;
- removing portions of the tunneling oxide layer;
- removing portions of the silicon nitride layer;
- removing portions of the sacrificial oxide layer to form an oxide-nitride-oxide structure, wherein a remaining portion of the silicon nitride layer in the oxide-nitride-oxide structure is a storage film;
- forming a logic oxide spacer material over the substrate;
- forming a silicon nitride spacer material directly over the logic oxide spacer material;
- removing portions of the logic oxide spacer material and portions of the silicon nitride spacer material to form a silicon nitride spacer adjacent to the sidewall;
- wherein a first portion of the oxide-nitride-oxide structure is directly adjacent and substantially aligned with the sidewall of the gate stack and a second portion of the oxide-nitride-oxide structure is directly adjacent and substantially aligned with a channel region in the substrate, wherein the channel region in the substrate is adjacent the gate stack, and wherein the storage film is encapsulated by oxide materials of the oxide-nitride-oxide structure and of the logic oxide spacer material; and
- forming a source/drain region in the substrate and directly adjacent the silicon nitride spacer.

17. The method of claim 16, wherein the removing portions of the tunneling oxide layer, the removing portions of the silicon nitride storage film layer, and the removing portions of the sacrificial oxide layer are performed in one manufacturing step.

18. The method of claim 16, further comprising:
- forming a lightly doped drain region in the substrate directly adjacent the oxide-nitride-oxide structure; and
- forming a doped region in the lightly doped drain region, the doped region adjacent the spacer.

19. The method of claim 16, further comprising forming a silicon nitride contact etch sacrificial layer over the substrate, wherein the storage film is isolated from the silicon nitride contact etch sacrificial layer by the logic oxide spacer material.

20. The method of claim 16, further comprising forming a CMOS device in the substrate, wherein the CMOS device has a channel, and wherein a width of the channel is about 130 nanometers or less.

* * * * *